US006468701B1

(12) United States Patent
Koba

(10) Patent No.: US 6,468,701 B1
(45) Date of Patent: Oct. 22, 2002

(54) STENCIL MASK AND METHOD OF FORMING THE SAME

(75) Inventor: Fumihiro Koba, Tokyo (JP)

(73) Assignee: NEC Corporation, Tokyo (JP)

( * ) Notice: Subject to any disclaimer, the term of this patent is extended or adjusted under 35 U.S.C. 154(b) by 84 days.

(21) Appl. No.: 09/678,101

(22) Filed: Oct. 4, 2000

(30) Foreign Application Priority Data

Oct. 4, 1999 (JP) .............................................. 11-283545

(51) Int. Cl.⁷ ................................................. G03F 9/00
(52) U.S. Cl. ................................ 430/5; 378/34; 378/35
(58) Field of Search ............................... 430/5; 378/34, 378/35

(56) References Cited

U.S. PATENT DOCUMENTS

| | | | | |
|---|---|---|---|---|
| 5,858,576 A | * | 1/1999 | Takashi et al. ................. | 430/5 |
| 5,876,880 A | * | 3/1999 | Vonach et al. ................. | 430/5 |
| 5,972,794 A | * | 10/1999 | Katakura ........................ | 430/5 |
| 6,168,890 B1 | * | 1/2001 | Takahashi ...................... | 430/5 |
| 6,210,842 B1 | * | 4/2001 | Kim ............................... | 430/5 |
| 6,261,726 B1 | * | 7/2001 | Brooks et al. .................. | 430/5 |
| 6,300,017 B1 | * | 10/2001 | Rolfson et al. ................. | 430/5 |

FOREIGN PATENT DOCUMENTS

| | | |
|---|---|---|
| JP | 10-20095 | 1/1998 |
| JP | 10-260523 | 9/1998 |

* cited by examiner

*Primary Examiner*—Christopher G. Young
(74) *Attorney, Agent, or Firm*—Young & Thompson

(57) ABSTRACT

A stencil mask includes a mask pattern layer and a supporting layer underlying the mask pattern layer for supporting the mask pattern layer. The supporting layer is a multi-layered structure having layers that decrease in etching rate in a direction toward a top surface of the supporting layer.

21 Claims, 15 Drawing Sheets

STENCIL MASK AND METHOD OF FORMING THE SAME

BACKGROUND OF THE INVENTION

The present invention relates to a stencil mask to be used for an electron beam exposure, an ion-beam exposure and an X-ray beam exposure and a method of forming the stencil mask.

The stencil mask has a pattern of opening to be used for an electron beam exposure, an ion-beam exposure and an X-ray beam exposure in order to form a pattern over a metal thin film or a semiconductor substrate. The stencil mask is thus used as a mask to carry out an exposure to the resist film applied over the metal thin film or the semiconductor substrate in order to form a first resist pattern. The opening pattern of the stencil mask allows transmission of the electron beam, the ion-beam exposure or the X-ray beam and irradiation thereof onto the resist film.

An available wafer for the stencil mask may comprise combined wafers of a first silicon substrate having a pattern and a second silicon substrate serving as a supporting substrate. Another wafer for the stencil mask may comprise a single silicon substrate having an impurity doped epitaxial silicon layer. Usually, the combined wafers are often used. In any event, the stencil mask may comprise combined wafers of a first silicon substrate having a pattern and a second silicon substrate serving as a supporting substrate. The second silicon substrate as the supporting substrate is to prevent any deformation of the stencil mask. The stencil mask is so placed in an exposure system that the second silicon substrate is positioned under the first silicon substrate which will have a pattern. The second silicon substrate supports the first silicon substrate and prevents any deformation of the first silicon substrate. An etching stopper layer is often interposed between the first and second silicon substrates for protecting the first silicon substrate from any over-etching when the second silicon substrate is etched. This interposed layer serving as the etching stopper layer may comprise an inorganic layer such as a silicon dioxide layer. In Japanese laid-open patent publication No. 5-216216, it is disclosed that a first conventional stencil mask comprises the combined first and second silicon substrate, between which the inorganic etching stopper layer is interposed. Further, this publication also discloses that a second conventional stencil mask comprises the combined first and second silicon substrate, between which an ion-implanted layer is interposed.

FIGS. 1A through 1E are fragmentary cross sectional elevation views illustrative of a first conventional method of forming a first conventional stencil mask.

With reference to FIG. 1A, an inorganic film 112 of silicon dioxide having a thickness of 1 micrometer is deposited on a first silicon substrate 111.

With reference to FIG. 1B, a second silicon substrate 113 is placed on the inorganic film 112. A heat treatment is carried out at a temperature of 1100° C. for two hours, thereby to combine the first and second silicon substrates 111 and 113 to each other.

With reference to FIG. 1C, the second silicon substrate 113 is polished to reduce the thickness thereof to about 30 micrometers. First and second passivation inorganic films 114-1 and 114-2 of silicon dioxide having a thickness of 500 nanometers are formed on both surfaces of the combine the first and second silicon substrates 111 and 113 respectively. A first resist pattern is formed on the first passivation inorganic film 114-1 on the first silicon substrate 111 by use of a lithography technique. The first resist pattern is used as a mask for carrying out a selective etching to the first passivation inorganic film 114-1 on the first silicon substrate 111 for selectively removing the first passivation inorganic film 114-1, so that a center region of the bottom surface of the first silicon substrate 111 is shown. This first resist pattern is further used to carry out a back etching process as a wet etching to the first silicon substrate 111 by use of an ethylene amine pyrocatechol solution, so that a center region of the bottom surface of the inorganic film 112 is shown.

With reference to FIG. 1D, the first and second passivation inorganic films 114-1 and 114-2 are completely removed. A second resist pattern 115 is formed on a top surface of the second silicon substrate 113 by use of a lithography technique.

With reference to FIG. 1E, the second resist pattern 115 is used as a mask for carrying out a selective etching to the second silicon substrate 113 and the inorganic film 112 to form penetrating openings 200, whereby a stencil mask is completed which is superior in mechanical strength and high thermal stability.

In accordance with the first conventional stencil mask, the number of the fabrication processes is remarkably reduced. It is also easy to form the etching stopper interposed between the first and second silicon substrates. The first conventional stencil mask is capable of cutting an electron beam under an acceleration voltage of 50 kV. The first conventional stencil mask is also superior in thickness uniformity. The silicon dioxide film as the interposed etching stopper may be replaced with a silicon nitride film.

FIGS. 2A through 2E are fragmentary cross sectional elevation views illustrative of a second conventional method of forming a second conventional stencil mask.

With reference to FIG. 2A, an ion-implantation is carried out at an acceleration voltage in the range of 50–100 kV and a dose of 1E20/cm 2 for ion-implanting boron ions 142 into an upper region of a silicon substrate 111 to form an ion-implanted region 141 in the upper region of the silicon substrate 111.

With reference to FIG. 2B, a silicon epitaxial layer 143 is formed on the ion-implanted region 141 of the silicon substrate 111. First and second passivation silicon nitride films 144-1 and 144-2 on the bottom surface of the silicon substrate 111 and on the silicon epitaxial layer 143, respectively.

With reference to FIG. 2C, a first resist pattern not illustrated is formed on the first passivation silicon nitride film 144-1 by use of a lithography technique. The first resist pattern not illustrated is used as a mask for carrying out a selective etching to the first passivation silicon nitride film 144-1 on the bottom surface of the silicon substrate 111 for selectively removing the first passivation silicon nitride film 144-1, so that a center region of the bottom surface of the silicon substrate 111 is shown. This first resist pattern is further used to carry out a back etching process as a wet etching to the silicon substrate 111 by use of an ethylene amine pyrocatechol solution, so that a center region of the ion-implanted region 141 is shown. The first and second passivation silicon nitride films 144-1 and 144-2 are completely removed.

With reference to FIG. 2D, a second resist pattern 145 is formed on a top surface of the silicon epitaxial layer 143 by use of an electron beam lithography technique.

With reference to FIG. 2E, the second resist pattern 145 is used as a mask for carrying out a selective etching to the silicon epitaxial layer 143 and the ion-implanted region 141 to form penetrating openings 200, whereby a stencil mask is completed.

In accordance with the second conventional stencil mask, the ion-implanted region 141 serves as an etching stopper to the etching process to the silicon substrate 111 from the bottom side.

The first conventional stencil mask has a lamination structure of the silicon substrate, the silicon dioxide film and the silicon substrate. The second conventional stencil mask has a lamination structure of the silicon substrate, the ion-implanted region, and the impurity doped silicon epitaxial layer.

The above described first and second conventional fabrication processes have a problem in variation in etching rate of the back etching process for etching the silicon substrate serving as the supporting substrate. It is ideal for the back etching process that an etching rate is uniform in a plane vertical to an etching direction. The etching direction is vertical to the wafer surface. Namely, it is ideal for the back etching process that the etching rate is uniform in the plane vertical to the wafer surface. This means that an etching depth is kept uniform in the plane vertical to the wafer surface during the back etching process. If the back etching is stopped at an intermediate depth of the wafer, it is ideal that an etched surface has a high planarity with no over-etching nor under-etching.

Undesirably, during the etching process, the etching rate is not uniform in the plane vertical to the wafer surface and the etching depth varies in the plane vertical to the wafer surface. If the back etching is stopped at an intermediate depth of the wafer, it is undesirable that an etched surface has a surface roughness with over-etching and under-etching.

If during the etching process, the etching rate varies in the plane vertical to the wafer surface, then a stress due to the etching is non-uniformly applied in the wafer surface. If an abrupt stress is concentrated into a local part of the wafer, the stress applied part shows a strain such as a bend, a twist, a stretch or expansion. As a result, the pattern formation region of the stencil mask shows a deformation non-uniformly, whereby the pattern of the stencil mask has a distortion. In summary, the variation in etching rate in the plane vertical to the wafer surface causes a distortion of the wafer, and then the wafer is patterned to form a stencil mask pattern with a distortion, resulting in a deterioration in accuracy in the stencil mask pattern.

The reason why the etching rate varies in the plane vertical to the wafer surface is that the silicon substrate varies in the impurity concentration in the plane vertical to the wafer surface. If the impurity is boron and the etchant is an alkali solution such as a potassium hydroxide (KOH) solution, then an increase in the impurity concentration of the silicon substrate causes a decrease in etching rate. If the impurity is phosphorus and the etchant is fluorine acid solution, then an increase in the impurity concentration of the silicon substrate causes an increase in etching rate. It is, therefore, possible to solve the above problem by use of the silicon wafer having a uniform impurity-concentration in the plane vertical to the wafer surface.

The silicon wafer having a uniform impurity-concentration in the plane vertical to the wafer surface is, however, expensive. Once the stencil mask is completed, then the silicon substrate as the supporting substrate is free from any influence in characteristics thereof due to non-uniformity or variation in impurity concentration, for which reason it is undesirable in view of the cost to use an expensive wafer having a uniformity in impurity concentration in the plane vertical to the wafer surface.

The above first and second conventional techniques are further engaged with another problem in deteriorated etching accuracy, particularly this problem is serious to the above second conventional technique. The ion-implanted region of the silicon substrate causes the etching rate to be delayed but is imperfect as the etching stopper. Namely, the ion-implanted region of the silicon substrate may be etched. The silicon dioxide film interposed between the first and second silicon substrates is lower in etching rate than the ion-implanted region of the silicon substrate, but may also be etched. If the interposed layer is over-etched to the supporting silicon substrate, then the stencil mask pattern is defective. If the etched surface has a surface roughness due to over-etching and/or under-etching and a pattern-formed region of the stencil mask varies in thickness, then the stencil mask is deformed non-uniformly due to an applied stress which is caused by the fact that the stencil mask is heated by irradiation of electron beam. As a result, the stencil mask pattern has a distortion and is deteriorated in pattern accuracy.

In the above circumstances, it had been required to develop a novel stencil mask free from the above problem.

SUMMARY OF THE INVENTION

Accordingly, it is an object of the present invention to provide a novel stencil mask free from the above problems.

It is a further object of the present invention to provide a novel stencil mask allowing a uniform etching rate in the plane vertical to the wafer surface during the back etching process to the supporting silicon substrate.

It is a still further object of the present invention to provide a novel stencil mask having a highly accurate pattern.

It is yet a further object of the present invention to provide a novel method of forming a stencil mask free from the above problems.

It is further an object of the present invention to provide a novel method of forming a stencil mask allowing a uniform etching rate in the plane vertical to the wafer surface during the back etching process to the supporting silicon substrate.

It is moreover an object of the present invention to provide a novel method of forming a stencil mask having a highly accurate pattern.

In accordance with the present invention, the supporting layer is uniform in etching rate in a plane vertical to a surface of the supporting layer and generally decreases in etching rate in a direction toward a top surface of the supporting layer. For example, the supporting layer has a multi-layered structure including a top layer which is lowest in etching rate in all layers of the multi-layered structure forming the supporting layer. The supporting layer may comprise the top and bottom layers, wherein the bottom layer is higher in etching rate than the top layer. The back etching process for selectively etching the supporting layer decreases the etching rate as the back etching process is progressed. As the etching rate is decreased, the variation in etching rate in the plane vertical to the wafer surface is also suppressed. Even if the etching rate varies in the initial step for etching the supporting layer at a high etching rate, then as the back-etching process is progressed, the etching rate is decreased thereby to suppress the variation in etching rate in the plane vertical to the wafer surface, whereby the in-plane uniformity of the etching rate becomes high as the back etching is progressed, and thus a final back-etched surface has a high planarity. Therefore, a pattern-formed region of the finally formed stencil mask is highly uniform in thickness with no over-etching nor under-etching. As a result, the stencil mask has a highly accurate pattern.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1A:
FIGS. 1A through 1E are fragmentary cross sectional elevation views illustrative of a first conventional method of forming a first conventional stencil mask.
Figure 1B:
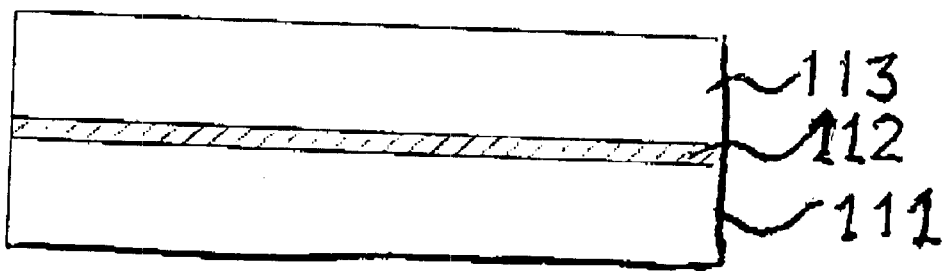
Figure 1C:
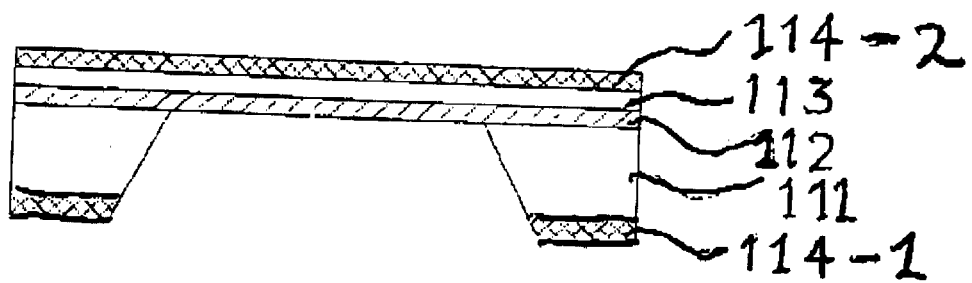
Figure 1D:
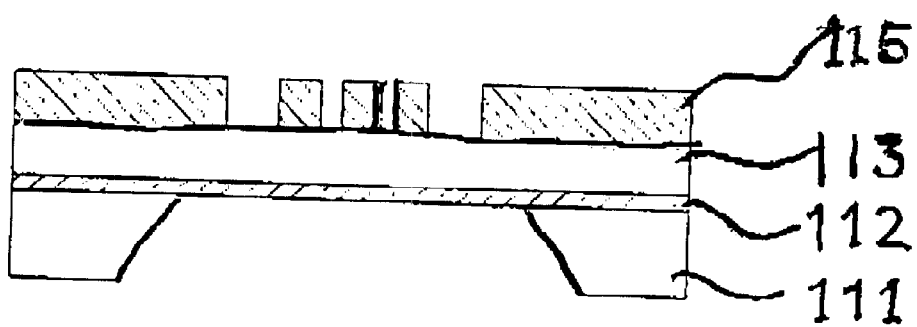
Figure 1E:
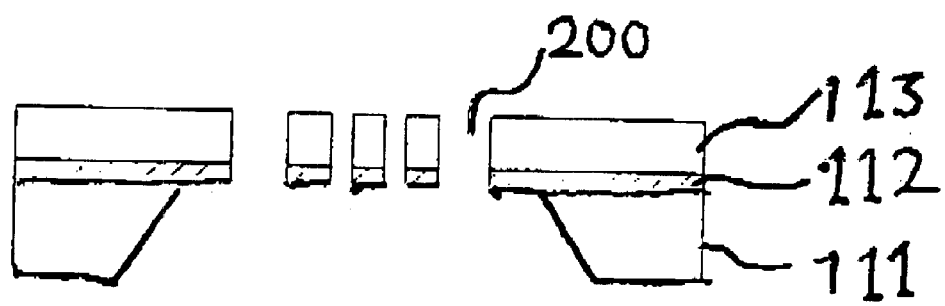
Figure 2A:
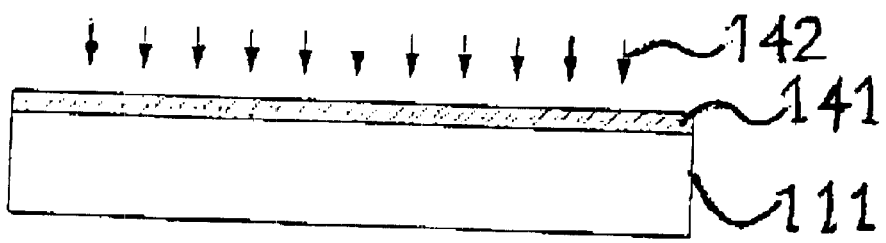
FIGS. 2A through 2E are fragmentary cross sectional elevation views illustrative of a second conventional method of forming a second conventional stencil mask.
Figure 2B:
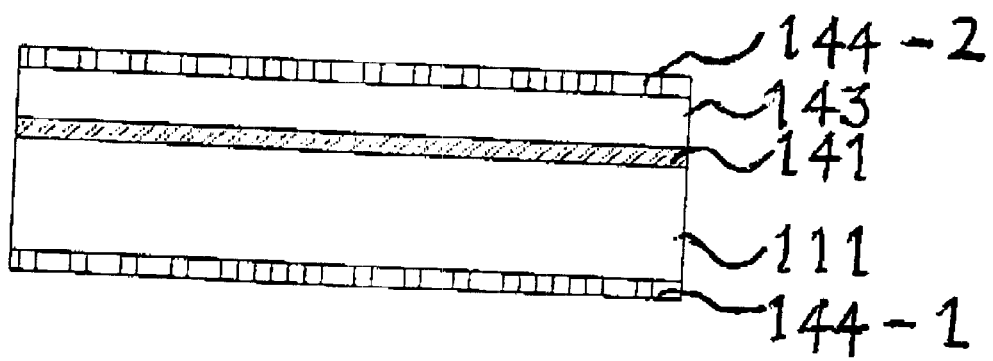
Figure 2C:
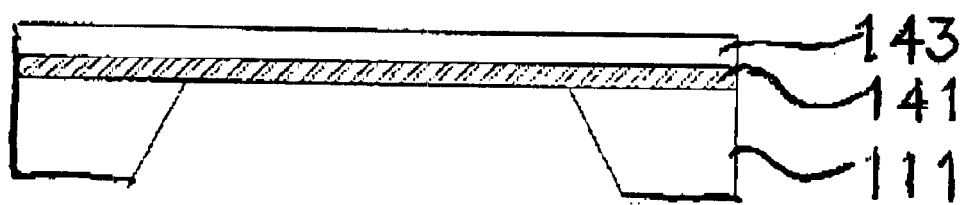
Figure 2D:
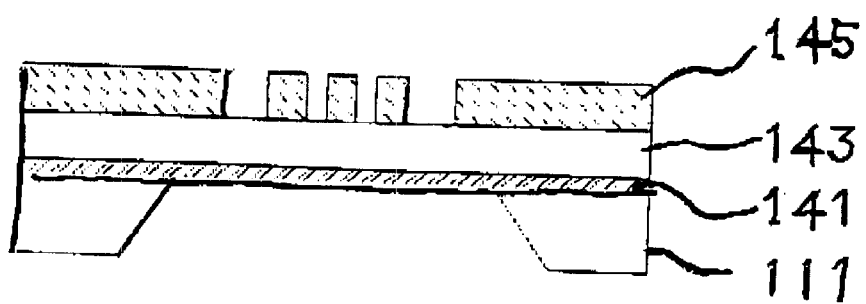
Figure 2E:
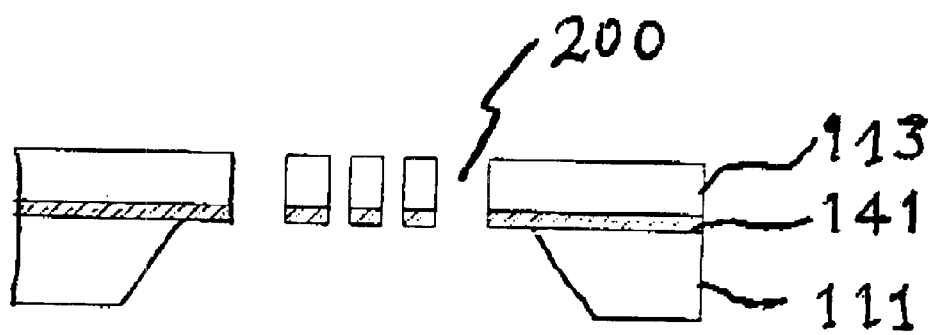

The first present invention provides a stencil mask comprising a mask pattern layer and a supporting layer underlying the mask pattern layer for supporting the mask pattern layer, wherein the supporting layer has a multi-layered structure including a top layer which is lowest in etching rate in all layers of the multi-layered structure forming the supporting layer.

It is preferable that the multi-layered structure of the supporting layer comprises a top layer having a first etching rate and a bottom layer underlying the top layer and having a second etching rate higher than the first etching rate of the top layer.

It is preferable also to further comprise at least an interposed layer between the mask pattern layer and the supporting layer.

In accordance with the first present invention, the supporting layer has a multi-layered structure including a top layer which is lowest in etching rate in all layers of the multi-layered structure forming the supporting layer. For example, the supporting layer comprises the top and bottom layers, wherein the bottom layer is higher in etching rate than the top layer. The back etching process for selectively etching the supporting layer comprises a first step for etching the bottom layer having the higher etching rate and a second step for etching the top layer having the lower etching rate. The bottom layer having the high etching rate is likely to allow variation in etching rate in the plane vertical to the wafer surface, whilst the top layer having the low etching rate is likely to suppress variation in etching rate in the plane vertical to the wafer surface. Even if the etching rate varies in the first step for etching the bottom layer of the supporting layer at a high etching rate, then in the second step, the top layer having the low etching rate suppresses the variation in etching rate in the plane vertical to the wafer surface, whereby the in-plane uniformity of the etching rate becomes high, as the back etching is progressed, and thus a final back-etched surface has a high planarity. Therefore, a pattern-formed region of the finally formed stencil mask is highly uniform in thickness with no over-etching nor under-etching. As a result, the stencil mask has a highly accurate pattern.

The second present invention provides a stencil mask comprising: a mask pattern layer; and a supporting layer underlying the mask pattern layer for supporting the mask pattern layer, wherein the supporting layer generally decreases in etching rate in a direction toward a top surface of the supporting layer.

It is preferable that the supporting layer has a multi-layered structure including a top layer which is lowest in etching rate in all layers of the multi-layered structure forming the supporting layer.

It is further preferable that the multi-layered structure of the supporting layer comprises a top layer having a first etching rate and a bottom layer underlying the top layer and having a second etching rate higher than the first etching rate of the top layer.

It is preferable also to further comprise at least an interposed layer between the mask pattern layer and the supporting layer.

In accordance with the second present invention, the supporting layer is uniform in etching rate in-plane vertical to a surface of the supporting layer and generally decreases in etching rate in a direction toward a top surface of the supporting layer. For example, the supporting layer has a multi-layered structure including a top layer which is lowest in etching rate in all layers of the multi-layered structure forming the supporting layer. The supporting layer may comprise the top and bottom layers, wherein the bottom layer is higher in etching rate than the top layer. The back etching process for selectively etching the supporting layer decreases the etching rate as the back etching process is progressed. As the etching rate is decreased, the variation in etching rate in the plane vertical to the wafer surface is also suppressed. Even if the etching rate varies in the initial step for etching the supporting layer at a high etching rate, then as the back-etching process is progressed, the etching rate is decreased thereby to suppresses the variation in etching rate in the plane vertical to the wafer surface, whereby the in-plane uniformity of the etching rate becomes high as the back etching is progressed, and thus a final back-etched surface has a high planarity. Therefore, a pattern-formed region of the finally formed stencil mask is highly uniform in thickness with no over-etching nor under-etching. As a result, the stencil mask has a highly accurate pattern.

The etching rate to the silicon substrate or the silicon layer depends upon the impurity concentration of the silicon substrate or the silicon layer. In a case, the increase in impurity concentration of the silicon substrate or the silicon layer causes an increase in the etching rate. In another case, the increase in impurity concentration of the silicon substrate or the silicon layer causes a decrease in the etching rate. In order to improve the in-plane uniformity of the etching rate in the plane vertical to the wafer surface, it is effective to reduce the etching rate.

The third present invention provides a stencil mask comprising a mask pattern layer; and a supporting layer underlying the mask pattern layer for supporting the mask pattern layer, wherein the supporting layer has a multi-layered structure including a top layer which is highest in impurity concentration in all layers of the multi-layered structure forming the supporting layer, and an impurity doped in the supporting layer is a first type impurity having a first property which causes an increase in impurity concentration to reduce an etching rate to the supporting layer.

It is preferable that the multi-layered structure of the supporting layer comprises a top layer having a first impurity concentration and a bottom layer underlying the top layer and having a second impurity concentration lower than the first impurity concentration of the top layer.

It is preferable to further comprise at least an interposed layer between the mask pattern layer and the supporting layer.

It is also preferable that the supporting layer is made of silicon.

It is also preferable that the impurity doped to the supporting layer is boron.

In accordance with the third present invention, the supporting layer has the multi-layered structure including the top layer which is highest in impurity concentration in all layers of the multi-layered structure forming the supporting layer, provided that the impurity doped in the supporting layer is the first type impurity having the first property which causes the increase in impurity concentration to reduce the etching rate to the supporting layer. For example, the multi-layered structure of the supporting layer comprises the top layer having the first impurity concentration and the bottom layer underlying the top layer and having the second impurity concentration higher than the first impurity concentration of the top layer. The supporting layer varying in impurity concentration in depth direction or thickness direction vertical to the surface of the supporting layer may be made of an epitaxial growth method or an ion-implantation method. If the epitaxial growth method is used, a rate of supplying the impurity to a crystal structure of the supporting layer is so controlled that the impurity concentration varies in depth direction or thickness direction vertical to the surface of the supporting layer. If the ion-implantation method is used, an acceleration voltage and a dose of the impurity are so controlled that the impurity concentration varies in depth direction or thickness direction vertical to the surface of the supporting layer. It is also possible to carry out plural discontinuous epitaxial growths or plural ion-implantation processes to the single wafer to form the multilayer structure differing in impurity concentration from each other. If the supporting layer comprises the top and bottom layers, then it is possible that the top and bottom layers are independently formed by the epitaxial growth processes or the ion-implantation processes before the impurity doped top and bottom layers are combined with each other in the known technique to form the multilayer structure differing in impurity concentration from each other. If the epitaxial growth method or the ion-implantation method is selected, the in-plane uniformity of the impurity concentration in the plane vertical to the surface of the supporting layer is improved.

It is also possible that the top layer of the supporting layer comprises a silicon insulating layer such as a silicon oxide film or a silicon nitride film, because the silicon insulating layer is very low in etching rate, whereby the in-plane uniformity of the etching rate in the plane vertical to the surface of the supporting layer is very high. For example, the above described multilayer structure of the supporting layer may include an impurity doped silicon bulk layer, at least an impurity doped silicon thin layer which is higher in impurity concentration than the impurity doped silicon bulk layer and which extends over the impurity doped silicon bulk layer, and a silicon insulative layer extending over the at least impurity doped silicon thin layer. The at least impurity doped silicon thin layer may comprise an impurity doped silicon epitaxial layer. Alternatively, the at least impurity doped silicon thin layer may comprise an ion-implanted silicon layer.

If potassium hydroxide solution is used as an etchant, boron is one of the first type impurity having the first property which causes an increase in impurity concentration to reduce an etching rate to the supporting layer. The silicon insulative layer such as the silicon oxide layer and the silicon nitride layer is much lower in etching rate than the boron-implanted silicon layer when the potassium hydroxide solution is used for the etchant.

The fourth present invention provides a stencil mask comprising: a mask pattern layer; and a supporting layer underlying the mask pattern layer for supporting the mask pattern layer, wherein the supporting layer generally increases in impurity concentration in a direction toward a top surface of the supporting layer, and an impurity doped in the supporting layer is a first type impurity having a first property which causes an increase in impurity concentration to reduce an etching rate to the supporting layer.

It is preferable that the supporting layer has a multi-layered structure including a top layer which is highest in impurity concentration in all layers of the multi-layered structure forming the supporting layer. It is preferable to further comprise at least an interposed layer between the mask pattern layer and the supporting layer. It is preferable that the supporting layer is made of silicon.

It is also preferable that the impurity doped to the supporting layer is boron.

It is also preferable that the multilayer structure of the supporting layer includes: an impurity doped silicon bulk layer; at least an impurity doped silicon thin layer which is higher in impurity concentration than the impurity doped silicon bulk layer and which extends over the impurity doped silicon bulk layer; and a silicon insulative layer extending over the at least impurity doped silicon thin layer. It is further preferable that the at least impurity doped silicon thin layer comprises an impurity doped silicon epitaxial layer. It is further preferable that the at least impurity doped silicon thin layer comprises an ion-implanted silicon layer.

In accordance with the fourth present invention, the supporting layer generally increases in impurity concentration in a direction toward a top surface of the supporting layer, and an impurity doped in the supporting layer is a first type impurity having a first property which causes an increase in impurity concentration to reduce an etching rate to the supporting layer. For example, the supporting layer has the multi-layered structure including the top layer which is highest in impurity concentration in all layers of the multi-layered structure forming the supporting layer, provided that the impurity doped in the supporting layer is the first type impurity having the first property which causes the increase in impurity concentration to reduce the etching rate to the supporting layer. For example, the multi-layered structure of the supporting layer comprises the top layer having the first impurity concentration and the bottom layer underlying the top layer and having the second impurity concentration higher than the first impurity concentration of the top layer. The supporting layer varying in impurity concentration in depth direction or thickness direction vertical to the surface of the supporting layer may be made of an epitaxial growth method or an ion-implantation method. If the epitaxial growth method is used, a rate of supplying the impurity to a crystal structure of the supporting layer is so controlled that the impurity concentration varies in depth direction or thickness direction vertical to the surface of the supporting layer. If the ion-implantation method is used, an acceleration voltage and a dose of the impurity are so controlled that the impurity concentration varies in depth direction or thickness direction vertical to the surface of the supporting layer. It is also possible to carry out plural discontinuous epitaxial growths or plural ion-implantation processes to the single wafer to form the multilayer structure differing in impurity concentration from each other. If the supporting layer comprises the top and bottom layers, then it is possible that the top and bottom layers are independently formed by the epitaxial growth processes or the ion-implantation processes before the impurity doped top and bottom layers are combined with each other in the known technique to form the multilayer structure differing in impurity concentration from each other. If the epitaxial growth method or the ion-implantation method is selected, the in-plane uniformity of the impurity concentration in the plane vertical to the surface of the supporting layer is improved.

It is also possible that the top layer of the supporting layer comprises a silicon insulating layer such as a silicon oxide film or a silicon nitride film, because the silicon insulating layer is very low in etching rate, whereby the in-plane uniformity of the etching rate in the plane vertical to the surface of the supporting layer is very high. For example, the above described multilayer structure of the supporting layer may include an impurity doped silicon bulk layer, at least an impurity doped silicon thin layer which is higher in impurity concentration than the impurity doped silicon bulk layer and which extends over the impurity doped silicon bulk layer, and a silicon insulative layer extending over the at least impurity doped silicon thin layer. The at least impurity doped silicon thin layer may comprise an impurity doped silicon epitaxial layer. Alternatively, the at least impurity doped silicon thin layer may comprise an ion-implanted silicon layer.

If potassium hydroxide solution is used as an etchant, boron is one of the first type impurity having the first property which causes an increase in impurity concentration to reduce an etching rate to the supporting layer. The silicon insulative layer such as the silicon oxide layer and the silicon nitride layer is much lower in etching rate than the boron-implanted silicon layer when the potassium hydroxide solution is used for the etchant.

The fifth present invention provides a stencil mask comprising: a mask pattern layer; and a supporting layer underlying the mask pattern layer for supporting the mask pattern layer, wherein the supporting layer has a multi-layered structure including a top layer which is lowest in impurity concentration in all layers of the multi-layered structure forming the supporting layer, and an impurity doped in the supporting layer is a second type impurity having a second property which causes a decrease in impurity concentration to reduce an etching rate to the supporting layer.

It is preferable that the multi-layered structure of the supporting layer comprises a top layer having a first impurity concentration and a bottom layer underlying the top layer and having a second impurity concentration lower than the first impurity concentration of the top layer.

It is further preferable to comprise at least an interposed layer between the mask pattern layer and the supporting layer.

It is also preferable that the supporting layer is made of silicon.

In accordance with the fifth present invention, the supporting layer has a multi-layered structure including a top layer which is lowest in impurity concentration in all layers of the multi-layered structure forming the supporting layer, and an impurity doped in the supporting layer is a second type impurity having a second property which causes a decrease in impurity concentration to reduce an etching rate to the supporting layer. For example, the multi-layered structure of the supporting layer comprises the top layer having the first impurity concentration and the bottom layer underlying the top layer and having the second impurity concentration lower than the first impurity concentration of the top layer. The supporting layer varying in impurity concentration in depth direction or thickness direction vertical to the surface of the supporting layer may be made of an epitaxial growth method or an ion-implantation method. If the epitaxial growth method is used, a rate of supplying the impurity to a crystal structure of the supporting layer is so controlled that the impurity concentration varies in depth direction or thickness direction vertical to the surface of the supporting layer. If the ion-implantation method is used, an acceleration voltage and a dose of the impurity are so controlled that the impurity concentration varies in depth direction or thickness direction vertical to the surface of the supporting layer. It is also possible to carry out plural discontinuous epitaxial growths or plural ion-implantation processes to the single wafer to form the multilayer structure differing in impurity concentration from each other. If the supporting layer comprises the top and bottom layers, then it is possible that the top and bottom layers are independently formed by the epitaxial growth processes or the ion-implantation processes before the impurity doped top and bottom layers are combined with each other in the known technique to form the multilayer structure differing in impurity concentration from each other. If the epitaxial growth method or the ion-implantation method is selected, the in-plane uniformity of the impurity concentration in the plane vertical to the surface of the supporting layer is improved.

The sixth present invention provides a stencil mask comprising: a mask pattern layer; and a supporting layer underlying the mask pattern layer for supporting the mask pattern layer, wherein the supporting layer generally decreases in impurity concentration in a direction toward a top surface of the supporting layer, and an impurity doped in the supporting layer is a second type impurity having a second property which causes a decrease in impurity concentration to reduce an etching rate to the supporting layer.

It is preferable that the supporting layer has a multi-layered structure including a top layer which is lowest in impurity concentration in all layers of the multi-layered structure forming the supporting layer.

It is preferable to further comprise at least an interposed layer between the mask pattern layer and the supporting layer.

It is also preferable that the supporting layer is made of silicon.

In accordance with the sixth present invention, the supporting layer generally decreases in impurity concentration in a direction toward a top surface of the supporting layer, and an impurity doped in the supporting layer is a second type impurity having a second property which causes a decrease in impurity concentration to reduce an etching rate to the supporting layer. For example, the supporting layer has a multi-layered structure including a top layer which is lowest in impurity concentration in all layers of the multi-layered structure forming the supporting layer, and an impurity doped in the supporting layer is a second type impurity having a second property which causes a decrease in impurity concentration to reduce an etching rate to the supporting layer. For example, the multi-layered structure of the supporting layer comprises the top layer having the first impurity concentration and the bottom layer underlying the top layer and having the second impurity concentration lower than the first impurity concentration of the top layer. The supporting layer varying in impurity concentration in depth direction or thickness direction vertical to the surface of the supporting layer may be made of an epitaxial growth method or an ion-implantation method. If the epitaxial growth method is used, a rate of supplying the impurity to a crystal structure of the supporting layer is so controlled that the impurity concentration varies in depth direction or thickness direction vertical to the surface of the supporting layer. If the ion-implantation method is used, an acceleration voltage and a dose of the impurity are so controlled that the impurity concentration varies in depth direction or thickness direction vertical to the surface of the supporting layer. It is also possible to carry out plural discontinuous epitaxial growths or plural ion-implantation processes to the single wafer to form the multilayer structure differing in impurity concentration from each other. If the supporting layer comprises the top and bottom layers, then it is possible that the top and bottom layers are independently formed by the epitaxial growth processes or the ion-implantation processes before the impurity doped top and bottom layers are combined with each other in the known technique to form the multilayer structure differing in impurity concentration from each other. If the epitaxial growth method or the ion-implantation method is selected, the in-plane uniformity of the impurity concentration in the plane vertical to the surface of the supporting layer is improved.

The seventh present invention provides a method of forming a stencil mask, comprising the steps of: forming an insulating layer on a first silicon substrate and also forming a low etching rate layer on a second silicon substrate, wherein the low etching rate layer is lower in etching rate than the second silicon substrate; bonding the first and second silicon substrates so that the insulating layer and the low etching rate layer are in contact with each other; and selectively etching the first silicon substrate to form a mask pattern in the first silicon substrate and also selectively back-etching the second silicon substrate to form a supporting substrate which supports the mask pattern.

It is preferable that the first silicon substrate is selectively etched to form the mask pattern before the second silicon substrate is selectively back-etched to form the supporting substrate.

The low etching rate layer may be formed by a silicon epitaxial growth or an ion-implantation process.

In accordance with the seventh present invention, the supporting layer has a multi-layered structure comprising the second silicon substrate and the low etching rate layer which is lower in etching rate than the second silicon substrate. The back etching process for selectively etching the supporting layer comprises a first step for etching the second silicon substrate having the higher etching rate and a second step for etching the low etching rate layer having the lower etching rate. The second silicon substrate having the high etching rate is likely to allow variation in etching rate in the plane vertical to the wafer surface, whilst the low etching rate layer having the low etching rate is likely to suppress variation in etching rate in the plane vertical to the wafer surface. Even if the etching rate varies in the first step for etching the second silicon substrate at a high etching rate, then in the second step, the low etching rate layer having the low etching rate suppresses the variation in etching rate in the plane vertical to the wafer surface, whereby the in-plane uniformity of the etching rate becomes high, as the back etching is progressed, and thus a final back-etched surface has a high planarity. Therefore, a pattern-formed region of the finally formed stencil mask is highly uniform in thickness with no over-etching nor under-etching. As a result, the stencil mask has a highly accurate pattern.

The eighth present invention provides a method of forming a stencil mask, comprising the steps of: forming an insulating layer on a first silicon substrate and also forming a high impurity concentration layer on a second silicon substrate, wherein the high impurity concentration layer is higher in impurity concentration than the second silicon substrate and wherein an impurity doped in the high impurity concentration layer and the second silicon substrate is a first type impurity having a first property which causes an increase in impurity concentration to reduce an etching rate; bonding the first and second silicon substrates so that the insulating layer and the low etching rate layer are in contact with each other; and selectively etching the first silicon substrate to form a mask pattern in the first silicon substrate and also selectively back-etching the second silicon substrate to form a supporting substrate which supports the mask pattern.

It is preferable that the first silicon substrate is selectively etched to form the mask pattern before the second silicon substrate is selectively back-etched to form the supporting substrate.

The high impurity concentration layer may be formed by a silicon epitaxial growth or an ion-implantation process.

In accordance with the eighth present invention, the high etching impurity concentration layer is higher in impurity concentration than the second silicon substrate and an impurity doped in the high impurity concentration layer and the second silicon substrate is a first type impurity having a first property which causes an increase in impurity concentration to reduce an etching rate. The back etching process for selectively etching the supporting layer comprises a first step for etching the second silicon substrate having the higher etching rate and a second step for etching the high impurity concentration layer having the lower etching rate. The second silicon substrate having the high etching rate is likely to allow variation in etching rate in the plane vertical to the wafer surface, whilst the high impurity concentration layer having the low etching rate is likely to suppress variation in etching rate in the plane vertical to the wafer surface. Even if the etching rate varies in the first step for etching the second silicon substrate at a high etching rate, then in the second step, the high impurity concentration layer having the low etching rate suppresses the variation in etching rate in the plane vertical to the wafer surface, whereby the in-plane uniformity of the etching rate becomes high, as the back etching is progressed, and thus a final back-etched surface has a high planarity. Therefore, a pattern-formed region of the finally formed stencil mask is highly uniform in thickness with no over-etching nor under-etching. As a result, the stencil mask has a highly accurate pattern.

PREFERRED EMBODIMENT

A first embodiment according to the present invention will be described in detail with reference to the drawings. FIGS. 3A through 3E are fragmentary cross sectional elevation views illustrative of a first novel conventional method of forming a first novel stencil mask in a first embodiment in accordance with the present invention.

Figure 3A:
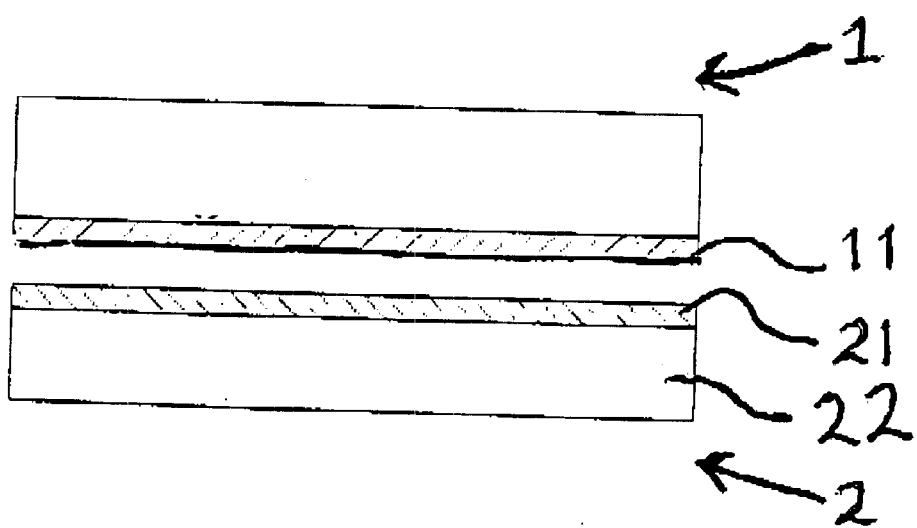
FIGS. 3A through 3E are fragmentary cross sectional elevation views illustrative of a first novel method of forming a first novel stencil mask in a first embodiment in accordance with the present invention.

With reference to FIG. 3A, a silicon dioxide film 11 is formed on a first silicon substrate 1. The silicon dioxide film 11 may be formed by a chemical vapor deposition or a thermal oxidation to a surface of the first silicon substrate 1. An ion-implantation is carried out for introducing boron into a second silicon substrate 2 which has a low impurity concentration of boron to form a boron-doped high impurity concentration thin film 21 in an upper region of the second silicon substrate 2 whereby the second silicon substrate 2 comprises the boron-doped high impurity concentration thin film 21 and a boron doped low impurity concentration bulk layer 22.

Figure 3B:
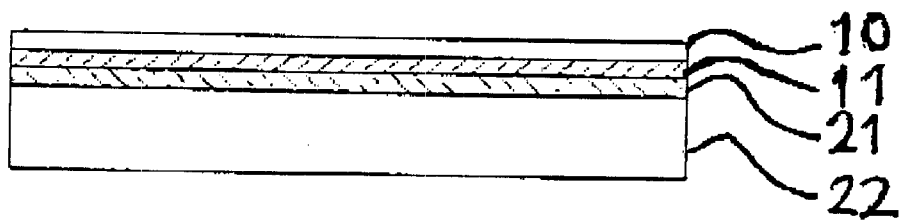

With reference to FIG. 3B, the first and second silicon substrates 1 and 2 are combined with each other so that the silicon dioxide film 11 and the boron doped low impurity concentration bulk layer 22 are made into contact with each other. Subsequently, a heat treatment is carried out to bond the silicon dioxide film 11 and the boron doped low impurity concentration bulk layer 22 to each other.

A surface of the first silicon substrate 1 is polished to reduce a thickness of the first silicon substrate 1, thereby forming a first silicon layer 10. The polishing may be carried out by a mechanical polishing method or a chemical polishing method.

Figure 3C:
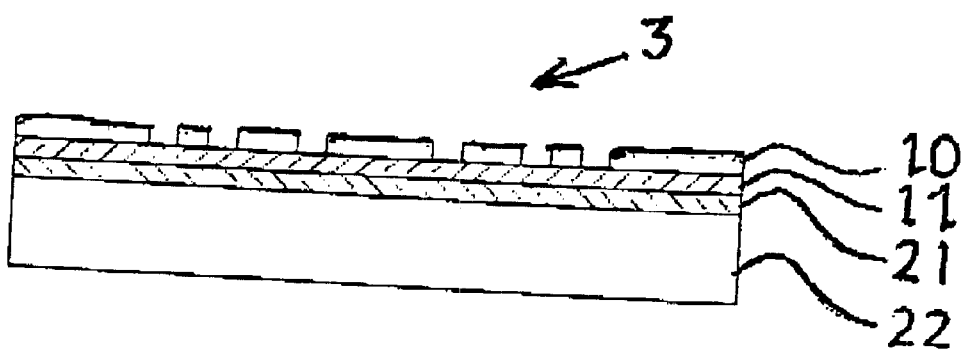

With reference to FIG. 3C, a first resist pattern not illustrated is formed by a known lithography technique. An anisotropic etching, for example, a dry etching is carried out by use of the first resist pattern to selectively etch the first silicon layer 10 to form a mask pattern 3 in the first silicon substrate 1. The used first mask pattern is then removed.

Figure 3D:
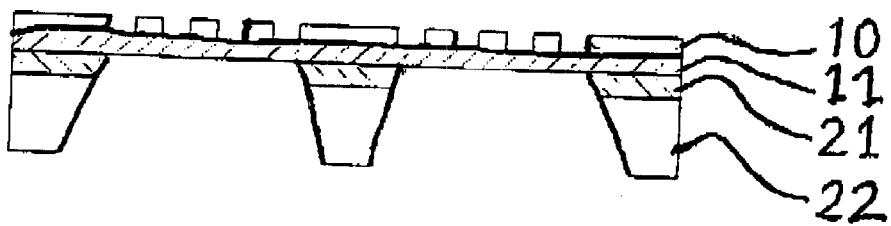

With reference to FIG. 3D, first and second passivation films not illustrated are formed on both the bottom surface of the boron doped low impurity concentration bulk layer 22 and the top surface of the first silicon layer 10 having the mask pattern 3, respectively. The first and second passivation films may be made of silicon nitride. A second resist pattern not illustrated is then formed by a known lithography technique on the second passivation film on the bottom surface of the boron doped low impurity concentration bulk layer 22. The second passivation film is then selectively etched by use of the second resist pattern to form a passivation film pattern not illustrated on the bottom surface of the boron doped low impurity concentration bulk layer 22. The second resist pattern is then removed. The passivation film pattern is used as a mask for a selective etching, for example, a wet etching by use of a potassium hydroxide solution as an etchant for selectively etching the boron doped low impurity concentration bulk layer 22 and the boron-doped high impurity concentration thin film 21, so that a part of the bottom surface of the silicon dioxide film 11 is shown. The boron doped low impurity concentration bulk layer 22 is selectively etched at a high etching rate before the boron-doped high impurity concentration thin film 21 is then selectively etched at a low etching rate. Even if the boron doped low impurity concentration bulk layer 22 varies in in-plane impurity concentration in the plane vertical to the surface of the boron doped low impurity concentration bulk layer 22 and the in-plane etching rate varies in the plane vertical to the surface of the boron doped low impurity concentration bulk layer 22, then the boron-doped high impurity concentration thin film 21 suppresses the variations in in-plane etching rate. The silicon dioxide film 11 serves as an etching stopper.

Figure 3E:
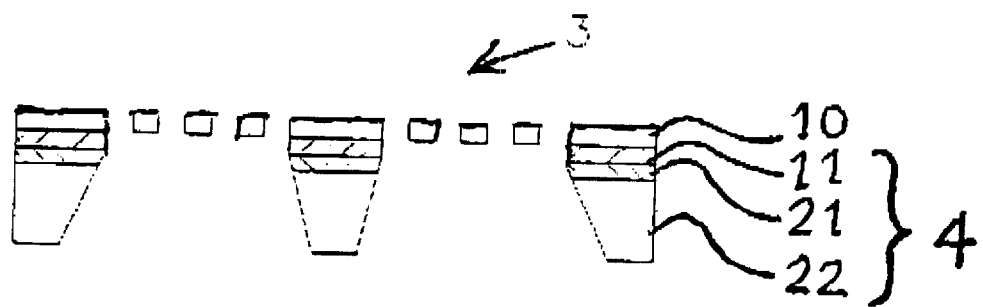

With reference to FIG. 3E, the silicon dioxide film 11 is further selectively etched from the bottom side by use of the passivation film a pattern on the boron doped low impurity concentration bulk layer 22, thereby to penetrate the mask pattern 3 of the first silicon layer 10 to the silicon dioxide film 11. The used first and second passivation films are then completely removed to form a novel stencil mask which comprises the first silicon layer 10 having the mask pattern 3 and a supporting plate 4 which further comprises laminations of the silicon dioxide film 11, the boron-doped high impurity concentration thin film 21, and the boron doped low impurity concentration bulk layer 22.

As a first modification to the above method, it is also possible that the back etching process for selectively etching the boron-doped high impurity concentration thin film 21, and the boron doped low impurity concentration bulk layer 22 is carried out before the mask pattern 3 is formed in the first silicon layer 10 and in the silicon dioxide film 11. In this case, the supporting plate 4 comprises laminations of the boron-doped high impurity concentration thin film 21, and the boron doped low impurity concentration bulk layer 22.

As a second modification to the above method, it is also possible that in place of formation of the silicon oxide film 11, a boron-implanted region is formed in a bonding side surface region which is in contact with the boron-doped high impurity concentration thin film 21, provided that the boron-implanted region is much higher in impurity concentration than the boron-doped high impurity concentration thin film 21.

In accordance with the present invention, the back etching process for selectively etching the supporting layer comprises a first step for etching the boron doped low impurity concentration bulk layer 22 having the higher etching rate and a second step for etching the boron-doped high impurity concentration thin film 21 having the lower etching rate. The boron doped low impurity concentration bulk layer 22 having the high etching rate is likely to allow variation in etching rate in the plane vertical to the wafer surface, whilst the boron-doped high impurity concentration thin film 21 having the low etching rate is likely to suppress variation in etching rate in the plane vertical to the wafer surface. Even if the etching rate varies in the first step for etching the boron doped low impurity concentration bulk layer 22 at a high etching rate, then in the second step, the boron-doped high impurity concentration thin film 21 having the low etching rate suppresses the variation in etching rate in the plane vertical to the wafer surface, whereby the in-plane uniformity of the etching rate becomes high, as the back etching is progressed, and thus a final back-etched surface has a high planarity. Therefore, a pattern-formed region of the finally formed stencil mask is highly uniform in thickness with no over-etching nor under-etching. As a result, the stencil mask has a highly accurate pattern.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A stencil mask comprising:
   a mask pattern layer; and
   a supporting layer underlying the mask pattern layer for supporting the mask pattern layer,
   wherein the supporting layer has a multi-layered structure including a top layer which is highest in impurity concentration in all layers of the multi-layered structure forming the supporting layer, and an impurity doped in the supporting layer is a first type impurity having a first property which causes an increase in impurity concentration to reduce an etching rate to the supporting layer, and wherein the multi-layered structure of the supporting layer includes:
an impurity doped silicon bulk layer;
at least one impurity doped silicon thin layer which is higher in impurity concentration than the impurity doped silicon bulk layer and which extends over the impurity doped silicon bulk layer; and
a silicon insulative layer extending over the at least one impurity doped silicon thin layer.

2. The stencil mask as claimed in claim 1, wherein the multi-layered structure of the supporting layer comprises a top layer having a first impurity concentration and a bottom layer underlying the top layer and having a second impurity concentration lower than the first impurity concentration of the top layer.

3. The stencil mask as claimed in claim 1, further comprising at least an interposed layer between the mask pattern layer and the supporting layer.

4. The stencil mask as claimed in claim 1, wherein the supporting layer is made of silicon.

5. The stencil mask as claimed in claim 1, wherein the impurity doped to the supporting layer is boron.

6. The stencil mask as claimed in claim 1, wherein the at least one impurity doped silicon thin layer comprises an impurity doped silicon epitaxial layer.

7. The stencil mask as claimed in claim 1, wherein the at least one impurity doped silicon thin layer comprises an ion-implanted silicon layer.

8. A method of forming a stencil mask, comprising the steps of:
forming an insulating layer on a first silicon substrate and also forming a low etching rate layer on a second silicon substrate, wherein the low etching rate layer is lower in etching rate than the second silicon substrate;
bonding the first and second silicon substrates so that the insulating layer and the low etching rate layer are in contact with each other; and
selectively etching the first silicon substrate to form a mask pattern in the first silicon substrate and also selectively back-etching the second silicon substrate to form a supporting substrate which supports the mask pattern.

9. The method as claimed in claim 8, wherein the first silicon substrate is selectively etched to form the mask pattern before the second silicon substrate is selectively back-etched to form the supporting substrate.

10. The method as claimed in claim 9, wherein the low etching rate layer is formed by a silicon epitaxial growth.

11. The method as claimed in claim 9, wherein the low etching rate layer is formed by an ion-implantation process.

12. A method of forming a stencil mask, comprising the steps of:
forming an insulating layer on a first silicon substrate and also forming a high impurity concentration layer on a second silicon substrate, wherein the low etching rate layer is higher in impurity concentration than the second silicon substrate and wherein an impurity doped in the high impurity concentration layer and the second silicon substrate is a first type impurity having a first property which causes an increase in impurity concentration to reduce an etching rate;
bonding the first and second silicon substrates so that the insulating layer and the low etching rate layer are in contact with each other; and
selectively etching the first silicon substrate to form a mask pattern in the first silicon substrate and also selectively back-etching the second silicon substrate to form a supporting substrate which supports the mask pattern.

13. The method as claimed in claim 12, wherein the first silicon substrate is selectively etched to form the mask pattern before the second silicon substrate is selectively back-etched to form the supporting substrate.

14. The method as claimed in claim 12, wherein the high impurity concentration layer is formed by a silicon epitaxial growth.

15. The method as claimed in claim 12, wherein the high impurity concentration layer is formed by an ion-implantation process.

16. A stencil mask comprising:
a mask pattern layer; and
a supporting layer underlying the mask pattern layer for supporting the mask pattern layer,
wherein the supporting layer has a multi-layered structure including a top layer having a first etching rate and a discrete bottom layer underlying the top layer and having a second etching rate higher than the first etching rate.

17. The stencil mask as claimed in claim 16, further comprising at least an interposed layer between the mask pattern layer and the supporting layer.

18. The stencil mask as claimed in claim 16, wherein the mask pattern layer is silicon.

19. The stencil mask as claimed in claim 16, wherein the supporting layer is silicon.

20. The stencil mask as claimed in claim 16, wherein the supporting layer contains an impurity dopant.

21. The stencil mask as claimed in claim 20, wherein the impurity dopant is boron.

* * * * *